(12) United States Patent
Bakker et al.

(10) Patent No.: US 6,519,752 B1
(45) Date of Patent: Feb. 11, 2003

(54) METHOD OF PERFORMING PARASITIC EXTRACTION FOR A MULTI-FINGERED TRANSISTOR

(75) Inventors: William C. Bakker, Poughkeepsie, NY (US); L. William Dewey, III, Wappingers Falls, NY (US); Peter A. Habitz, Hinesburg, VT (US); Judith H. McCullen, Essex Junction, VT (US); Edward W. Seibert, Richmond, VT (US); Michael J. Sullivan, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/561,096

(22) Filed: Apr. 28, 2000

(51) Int. Cl.$^7$ ................................................ G06F 17/50
(52) U.S. Cl. ....................................................... 716/14
(58) Field of Search ........................ 716/2, 5–8, 11–14

(56) References Cited

U.S. PATENT DOCUMENTS 5,754,826 A * 5/1998 Gamal et al. .................. 716/19
6,209,123 B1 * 3/2001 Maziasz et al. ............... 716/14

* cited by examiner

*Primary Examiner*—Matthew S. Smith
*Assistant Examiner*—Thuan Do
(74) *Attorney, Agent, or Firm*—McGinn & Gibb, PLLC; Richard M. Kotulak, Esq.

(57) ABSTRACT

A method and structure for performing parasitic extraction for a multi-fingered device comprising of establishing a maximum processing width of a finger of the device, dividing fingers of the device that exceed the maximum width into sub-fingers, determining whether ones of the fingers and the sub-fingers have similar characteristics, combining ones of the fingers and the sub-fingers that have similar characteristics into combined fingers, and extracting parasitic values from the fingers, the sub-fingers and the combined fingers.

26 Claims, 3 Drawing Sheets

FIG.2
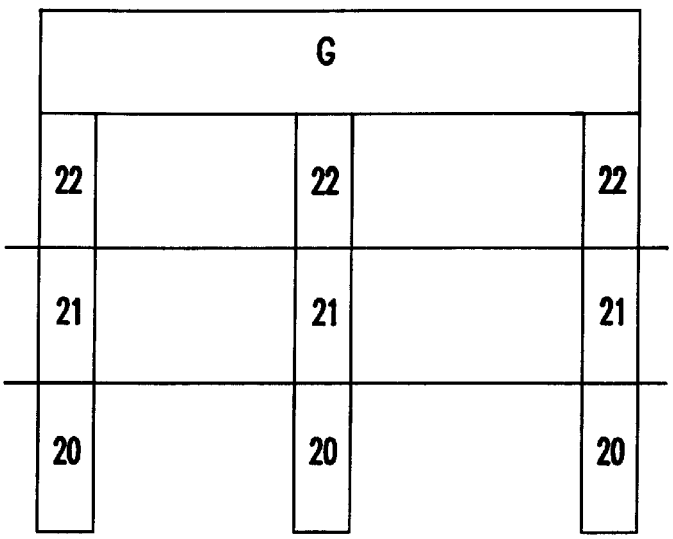
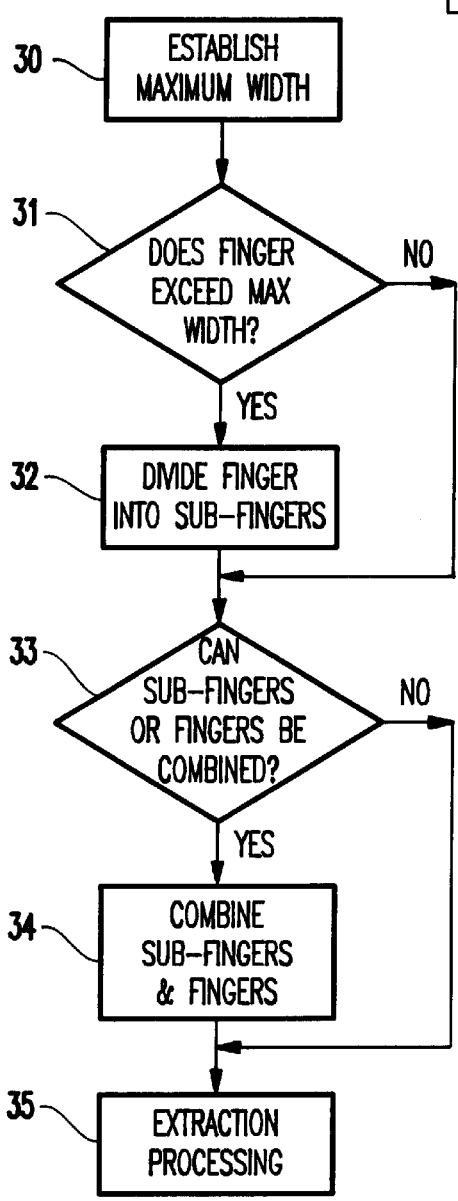
FIG.3

METHOD OF PERFORMING PARASITIC EXTRACTION FOR A MULTI-FINGERED TRANSISTOR

BACKGROUND OF THE INVENTION

1. Field of the Invention

The present invention generally relates to integrated circuit devices and more particularly to an improved system and method for measuring parasitic resistances on multi-finger transistor devices.

2. Description of the Related Art

Conventional transistor devices include a source, drain and gate. When current flows across the gate, a connection is either made or broken between the source and drain. Therefore, the transistor acts as a switch to connect or disconnect electronic components. Multi-finger integrated circuit devices include a single gate that is connected to multiple source contacts and multiple drain contacts. The multi-finger transistor performs the same functions as a conventional transistor (e.g., acts as a switch). However, the multi-finger device takes up less space and has less resistance than the conventional transistor device of the appropriate width. For these reasons (and others) the use of multi-finger transistors is increasing.

The output parameters of device models are usually scaled with the device width. However, when the width of the fingers becomes too large, the error in the approximation produces unacceptable results. More specifically, as the fingers become wider, the delay of the signal traveling along the finger becomes large enough to affect the model's accuracy. Also any voltage drop caused by the device current flowing through the source resistor changes significantly the overdrive of the device and with this the current charging the load, hence requiring an accurate description of the source resistance. Most commercial extraction programs ignore the device resistance to avoid the large number of resulting devices. No conventional program has the ability to create one multi-finger device model with resistance included. Therefore, there is a need to maintain the models' accuracy (even for wide-fingered devices) without slowing the netlists simulation time.

SUMMARY OF THE INVENTION

It is the object of the present invention to provide a structure and method for performing parasitic extraction for a multi-fingered device comprising establishing a maximum processing width of a finger of the device, dividing fingers of the device that exceed the maximum width into sub-fingers, determining which ones of the fingers and the sub-fingers have similar characteristics, combining the fingers and the sub-fingers that have the similar characteristics into combined fingers, and extracting the parasitic values from the fingers, the sub-fingers and the combined fingers into the final netlist.

The similar characteristics are comprised of electrical resistivity of the fingers and the sub-fingers. Each of the sub-fingers has a width no greater than the maximum processing width. Fingers exceeding the maximum width would produce erroneous results in the extraction process. From the relative geometric position of the sub-fingers to each other, the extraction program decides which ones have similar resistivities and then assigns names reflecting this situation to each of the sub-fingers. These names are then picked up during the recombination process. In this way only sub-fingers with similar characteristics are combined. The time required for the simulation of the extracted netlist is significantly reduced by the combining process.

BRIEF DESCRIPTION OF THE DRAWINGS

The foregoing and other objects, aspects and advantages will be better understood from the following detailed description of a preferred embodiment of the invention with reference to the drawings, in which:

FIG. 2 is a schematic diagram of sub-fingers;

FIG. 3 is a flowchart representation of the invention; and

DETAILED DESCRIPTION OF PREFERRED EMBODIMENTS OF THE INVENTION

While conventional parasitic extraction tools rely on the user to consider (or usually ignore) device parasitic resistance in the device model, the invention supplies a method for extending the extraction and modeling capability of the extraction program to the resistors connected to the source, drain and gate of field effect transistors (FETs). With the invention the ports at which the resistors are connected to the device are situated in the middle of the gate for the gate contact. A short stripe is created under the sidewall of the gate poly to connect to source and drain resistors to the device. In this situation, each finger of a multi-finger FET device is connected with a different theoretical resistor network, which makes all fingers unique and separated in the netlist.

If the contact is only on one end of the device the voltage drop along the width of the device can require a break up of the device for accurate description of the device current.

Therefore, to achieve good accuracy for the resistor network, wide devices are sometimes broken up into several sub-devices, each connected together with its own resistors. Thus, a wide 5 finger device, represented in the schematic netlist with one device model, will need 10 or more sub-device models in the extracted netlist. While this process increases accuracy for wide fingers, it is almost 10 times slower.

Figure 1A:
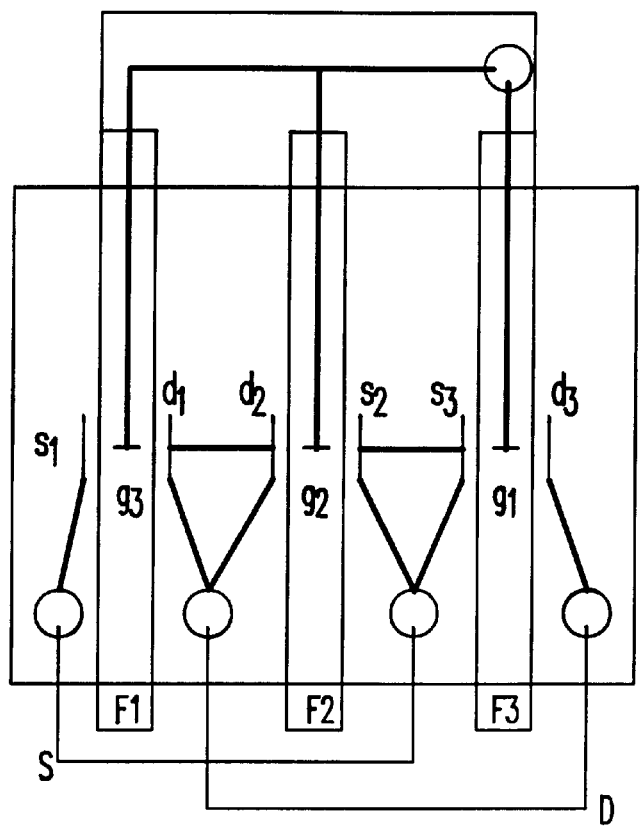
FIG. 1A is a schematic diagram of a multi-fingered field effect transistor.
Figure 1B:
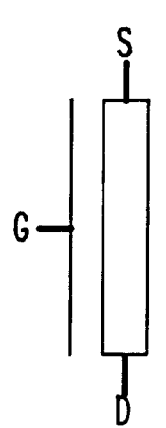
FIG. 1B is a symbolic diagram of a side view of the device shown in FIG. 1A.
Figure 1C:
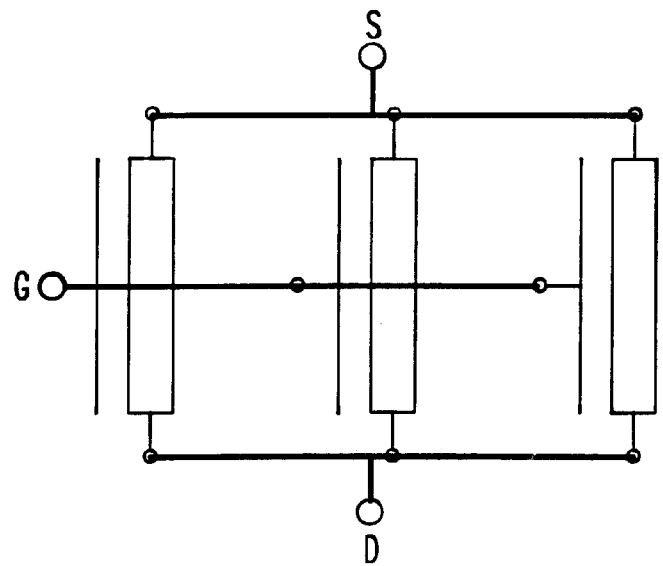
FIG. 1C is a symbolic diagram of the device shown in FIG. 1A.

Referring now to the drawings, and more particularly to FIGS. 1A—1C, a multi-finger FET is illustrated. FIGS. 1B and 1C show the layout and symbolic top views, respectively, of the structure shown in FIG. 1A. In this 3-finger device the device port G is modeled by connecting it with resistors to the gate ports g1, g2, g3 at the fingers F1, F2 and F3. Along the device, source S is modeled by connecting it with resistors s1, s2, s3 at the fingers and the drain D is connected at d1, d2 and d3 analogously. In addition s2, s3 and d1, d3 are modeled by being directly connected with resistors.

The resistance from the circuit connection to equivalent nodes on equivalent sub-devices of the multi-finger device is important but varies only slightly from transistor piece to piece, if geometric constraints are met. However, as discussed above, when the width of the fingers exceeds a geometric threshold, the accuracy of the model decreases below an acceptable point. A high performance short channel FET has a gate poly width of less than 0.15 um and, even if silicided, a sheetrho of 8 Ohm/square. The resistance of a gate of a 10 um wide device is therefore larger than 530 Ohms. Considering a gate capacitance of 12 fF this results in a delay of 6 ps per device or 10% of a high performance gate delay. This is ignored in conventional programs. In a high density angled device design the width of the source can be 0.1 um. Even if this narrow area is silicided and the count of sheetrho of 8 Ohm/square, the source resistance is larger than 250 Ohm and the voltage drop for 3 mA source drain current would be 750 mV, thus providing less than half of the expected current. The invention breaks up the devices and provides an accurate description of the device resistance to avoid incorrect predictions of the chip functionality.

In order to overcome the problem experienced when the width of the fingers exceeds the geometric threshold, the invention divides each finger into widths less than the largest acceptable finger width. Then, the invention runs the extraction program on each portion of the divided fingers. This allows the resistance along each portion of the finger to be accurately resolved. For example, if fingers on a 3-finger device were three times the acceptable width (causing the formation of 9 sub-fingers), the invention would make 9 model calls (e.g., one for each the 9 sub-fingers). After the modeling of each section of each of the fingers, the results are recombined to produce a model extraction for each finger, and the entire device as a whole.

This concept is shown schematically in FIG. 2. More specifically, the maximum allowable width W is exceeded by each of the fingers F1, F2, and F3. In the illustration shown, each finger is three times the maximum allowable width W. Therefore, each finger is modeled in three sub-fingers 20–22. As mentioned above, this eliminates the problem of modeling the resistance of a very wide finger.

Further, with the invention, equivalent nodes can be considered to move together during circuit operation, which is equivalent to shorting them together at the device port. More specifically, if the difference in the resistance from the device port G, S, D to the finger ports g1, s1, d1 is negligible (e.g. smaller than the error originally introduced in the port definition), the invention assumes that the resistance is equal. More specifically, the invention estimates the relative size of each resistor out of the relative geometric position of each device. Therefore, the invention measures the distance from the gate port and similarly from the source ports and the drain ports. Because the different resistances are mostly caused by different distances between the sub-finger ports to the port of the combined device, comparing these distances allows an estimate of the differences in the resistance to the sub-finger ports. The sub-finger devices are then ordered according to the distance to the device port and named according to this order. The post processing program, which then later recombines the devices, can then recognize equivalent devices and estimate the variation in resistance.

Thus, the equivalent nodes will move in parallel and can be electrically connected. This allows equivalent fingers to be recombined to simplify the resistive network analyzed by the model, thus decreasing simulation time without sacrificing accuracy.

Equivalent sub-fingers 20–22 of fingers F1–F3 of the device can then be represented as one sub-finger in the model. Thus, the resistors, which are now parallel and in series to each other, can be merged to combined single resistors to each port of the multi-finger network. The equivalent netlist now contains three 3-finger devices each connected with resistors instead of 9 individual devices. This results in the model running 3-times faster with the same accuracy. Therefore, the invention maintains accuracy by limiting the geometric size of the finger which is processed through the model and reduces the model's processing time by combining equivalent devices (e.g., equivalent sub-fingers and equivalent fingers).

To maintain accuracy, the geometric constrains on the selection of the sub-device must be strictly controlled. Also, the devices have to be very close together, so that the difference in the resistance to the sub-devices is smaller than the error introduced in the selection of the device port.

The selection of the device ports described above is an optimized compromise between different approximation of current flow through the device. The choice therefore contains on average a estimated 20% error in the resulting device resistance. By choosing more break points per device the error can be further reduced. In general the invention affords a resistance variation of about 20% without further introducing errors.

To ensure that the postprocessor can find the equivalent pieces for recombination, the invention controls the naming convention of the equivalent sub-fingers. Neighboring fingers have monotonically increasing indices, as do equivalent parts after device breakup. An exemplary name for a sub-finger is $xx_{13}$ $Fn_{13}$ PSRTm with n and m counting neighboring structures.

Therefore, the invention maintains the accuracy of the extraction modeling program for multi-finger transistor devices with wide fingers, without substantially increasing the processing time of the extraction program. The invention achieves these benefits by establishing a maximum finger width which will maintain a given accuracy level. The invention then divides the fingers that exceed the maximum width, recombines any identical or substantially similar sub-fingers, and performs the extraction program on the remaining sub-fingers.

FIG. 3 illustrates this process in flowchart form. More specifically, in item 30, the invention establishes the maximum width a finger may possess and still be processed accurately through the extraction program. If the fingers do not exceed the maximum width, then up to a certain number of them, normally about 5 fingers, are processed to see if they can be combined, as shown in item 33. However, if they do exceed the maximum width, the fingers are divided into sub-fingers, as shown in item 32. In item 33, the invention determines whether the sub-fingers or fingers can be combined. If they cannot, the sub-fingers and fingers are process directly through the extraction processing 35. Alternatively, as shown in item 34, the invention combines the sub-fingers and fingers before performing the extraction processing in item 35. As discussed above, the invented process maintains the accuracy required without increasing the simulation time.

Figure 4:
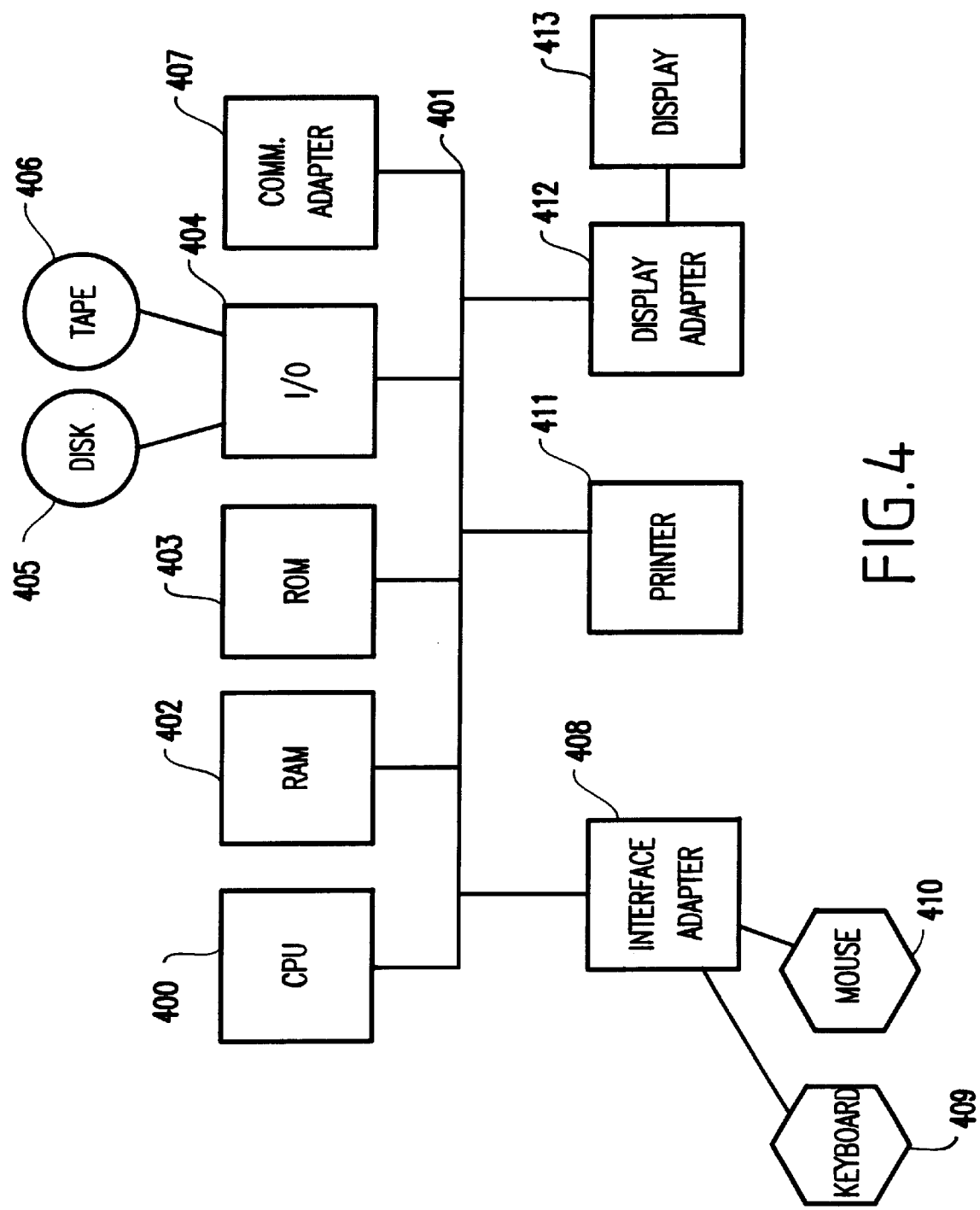
FIG. 4 is a hardware embodiment of the invention.

While the overall methodology of the invention is described above, the invention can be embodied in any number of different types of systems and executed in any number of different ways, as would be known by one ordinarily skilled in the art. For example, as illustrated in FIG. 4, a typical hardware configuration of an information handling/computer system in accordance with the invention preferably has at least one processor or central processing unit (CPU) 400. For example, the central processing unit 400 could include various image/texture processing units, mapping units, weighting units, classification units, clustering units, filters, adders, subtractors, comparators, etc. Alternatively, as would be known by one ordinarily skilled in the art given this disclosure, multiple specialized CPU's (or other similar individual functional units) could perform the same processing, mapping, weighting, classifying, clustering, filtering, adding, subtracting, comparing, etc. The CPU 400 is interconnected via a system bus 401 to a random access memory (RAM) 402, read-only memory (ROM) 403, input/output (I/O) adapter 404 (for connecting peripheral devices such as disk units 405 and tape drives 406 to the bus 401), communication adapter 407 (for connecting an information handling system to a data processing network) user interface adapter 408 (for connecting a peripherals 409–410 such as a keyboard, mouse, imager, microphone, speaker and/or other interface device to the bus 401), a printer 411, and display adapter 412 (for connecting the bus 401 to a display device 413). The invention could be implemented using the structure shown in FIG. 4 by including the inventive method, described above, within a computer program stored on the storage device 405. Such a computer program would act on a transistor design supplied through the interface units 409–410 or through the network connection 407. The system would then automatically extract the parasitic capacitance and output the same on the display 413, through the printer 411 or back to the network 407.

Further, while the invention is mentioned above with respect to a multi-finger field effect transistor, as would be known by one ordinarily skilled in the art given this disclosure, the invention and is equally applicable to any similar structure and similar extraction technique.

For example, decoupling capacitors and designed resistors are often laid out in a multi-finger scheme to reduce the parasitic resistance or improve the reliability of the design by delivering parallel paths for the current flow. Any similar structure can be processed with the invention to deliver a simplified model and, hence, faster and easier timing calculations.

While the invention has been described in terms of preferred embodiments, those skilled in the art will recognize that the invention can be practiced with modification within the spirit and scope of the appended claims.

What is claimed is:

1. A method of performing parasitic extraction for a multi-fingered transistor comprising:
    establishing a maximum processing width of a finger of said transistor;
    dividing fingers of said transistor that exceed said maximum width into sub-fingers;
    determining whether ones of said fingers and said sub-fingers have similar electrical characteristics;
    combining said fingers and said sub-fingers that have said similar electrical characteristics into combined fingers; and
    extracting parasitic values from said fingers, said sub-fingers and said combined fingers.

2. The method in claim 1, wherein said similar electrical characteristics comprise electrical resistivity of said fingers and said sub-fingers.

3. The method in claim 1, wherein each of said sub-fingers has a width no greater than said maximum processing width.

4. The method in claim 1, wherein a time required for simulation of said multi-fingered transistor is reduced by said combining process.

5. The method in claim 4, wherein fingers exceeding said maximum width produce erroneous results in said simulation of said multi-fingered transistor.

6. The method in claim 1, wherein said combining includes assigning similar identifiers to said ones of said fingers and said sub-fingers that have said similar electrical characteristics.

7. A method of performing parasitic extraction for a multi-fingered transistor comprising:
    determining whether fingers of said transistor have similar electrical characteristics;
    combining ones of said fingers that have said similar electrical characteristics into combined fingers; and
    extracting parasitic values from said fingers, said sub-fingers and said combined fingers.

8. The method in claim 7, further comprising, before said determining:
    establishing a maximum processing width of a finger of said transistor; and
    dividing fingers of said transistor that exceed said maximum width into sub-fingers.

9. The method in claim 8, wherein said similar electrical characteristics comprise electrical resistivity of said fingers and said sub-fingers.

10. The method in claim 8, wherein each of said sub-fingers has a width no greater than said maximum processing width.

11. The method in claim 8, wherein a time required for simulation of said multi-fingered transistor is reduced by said combining process.

12. The method in claim 8, wherein fingers exceeding said maximum width produce erroneous results in simulation of said multi-fingered transistor.

13. The method in claim 7, wherein said combining includes assigning similar names to said ones of said fingers that have said similar electrical characteristics.

14. A method of performing parasitic extraction for a multi-fingered transistor comprising:
    establishing a maximum processing width of a finger of said transistor;
    dividing fingers of said transistor that exceed said maximum width into sub-fingers;
    combining said fingers and said sub-fingers that have similar electrical characteristics into combined fingers; and
    extracting parasitic values from said fingers, said sub-fingers and combined fingers.

15. The method in claim 14, further comprising, before said extracting:
    determining whether ones of said fingers and said sub-fingers have similar electrical characteristics; and
    combining ones of said fingers and said sub-fingers that have said similar electrical characteristics into combined fingers.

16. The method in claim 15, wherein said similar electrical characteristics comprise electrical resistivity of said fingers and said sub-fingers.

17. The method in claim 15, wherein a time required for said simulation of said multi-fingered transistor is reduced by said combining process.

18. The method in claim 15, wherein said combining includes assigning similar identifiers to said ones of said fingers and said sub-fingers that have said similar electrical characteristics.

19. The method in claim 14, wherein each of said sub-fingers has a width no greater than said maximum processing width.

20. The method in claim 14, wherein fingers exceeding said maximum width produce erroneous results in said simulation of said multi-fingered transistor.

21. A program storage device readable by machine, tangibly embodying a program of instructions executable by the machine to perform a method of performing parasitic extraction for a multi-fingered transistor comprising of:

establishing a maximum processing width of a finger of said transistor;

dividing fingers of said transistor that exceed said maximum width into sub-fingers;

determining whether ones of said fingers and said sub-fingers have similar electrical characteristics;

combining ones of said fingers and said sub-fingers that have said similar electrical characteristics into combined fingers; and extracting parasitic values from said fingers, said sub-fingers and said combined fingers.

22. The program storage device in claim 21, wherein said similar electrical characteristics comprise electrical resistivity of said fingers and said sub-fingers.

23. The program storage device in claim 21, wherein each of said sub-fingers has a width no greater than said maximum processing width.

24. The program storage device in claim 21, wherein a time required for simulation of said multi-fingered transistor is reduced by said combining process.

25. The program storage device in claim 24, wherein fingers exceeding said maximum width produce erroneous results in said simulation of said multi-fingered transistor.

26. The program storage device in claim 21, wherein said combining includes assigning similar identifiers to said ones of said fingers and said sub-fingers that have said similar electrical characteristics.

* * * * *